(12) United States Patent
Chauhan et al.

(10) Patent No.: US 12,242,319 B2
(45) Date of Patent: Mar. 4, 2025

(54) POWER SUPPLY OPTIMIZATION BASED ON INTERFACE CARD POWER ENABLE SIGNALING

(71) Applicant: Intel Corporation, Santa Clara, CA (US)

(72) Inventors: Shailendra Singh Chauhan, Bengaluru (IN); Arunthathi Chandrabose, Bangalore (IN)

(73) Assignee: Intel Corporation, Santa Clara, CA (US)

(*) Notice: Subject to any disclaimer, the term of this patent is extended or adjusted under 35 U.S.C. 154(b) by 651 days.

(21) Appl. No.: 17/482,805

(22) Filed: Sep. 23, 2021

(65) Prior Publication Data

US 2023/0092240 A1    Mar. 23, 2023

(51) Int. Cl.
    *G06F 1/26*      (2006.01)
    *G06F 1/3234*    (2019.01)
    *H03F 3/24*      (2006.01)

(52) U.S. Cl.
    CPC ............. *G06F 1/266* (2013.01); *G06F 1/325* (2013.01); *H03F 3/24* (2013.01); *H03F 2200/294* (2013.01); *H03F 2200/451* (2013.01)

(58) Field of Classification Search
    CPC ... G06F 1/266; G06F 1/26; G06F 1/00; G06F 1/32; G06F 1/3203; G06F 1/3206; G06F 1/325; G06F 1/3296; Y02D 10/00

USPC .......................................................... 327/540
    See application file for complete search history.

(56) References Cited

U.S. PATENT DOCUMENTS

| | | | |
|---|---|---|---|
| 11,399,344 B2* | 7/2022 | Kumar | G06F 1/3221 |
| 11,614,872 B2* | 3/2023 | Rowley | G06F 1/3275 |
| | | | 713/320 |
| 2004/0107370 A1 | 6/2004 | Mosley | |
| 2006/0149975 A1 | 7/2006 | Rotem et al. | |
| 2008/0104425 A1 | 5/2008 | Gunther et al. | |
| 2008/0136397 A1 | 6/2008 | Gunther et al. | |
| 2011/0154081 A1 | 6/2011 | Allarey | |
| 2011/0179295 A1 | 7/2011 | Jahagirdar et al. | |
| 2012/0166844 A1 | 6/2012 | Morgan et al. | |

* cited by examiner

*Primary Examiner* — Hai L Nguyen
(74) *Attorney, Agent, or Firm* — Nicholson De Vos Webster & Elliott LLP

(57) ABSTRACT

An interface card includes a circuit board, a device mounted on the circuit board, and a PMIC mounted on the circuit board. The PMIC includes a PMIC processor communicatively coupled to a host processor of a host system. The PMIC processor is configured to receive an input voltage signal from a power supply that is external to the interface card. The PMIC processor generates at least one output voltage signal based on the input voltage signal. The at least one output voltage signal is supplied to the device. A power enable signal originating from the host processor is detected. The power enable signal is detected at a GPIO connector of the PMIC. The PMIC processor deactivates generation of the at least one output voltage signal based on the power enable signal.

20 Claims, 7 Drawing Sheets

POWER SUPPLY OPTIMIZATION BASED ON INTERFACE CARD POWER ENABLE SIGNALING

TECHNICAL FIELD

Embodiments pertain to improvements in computer architectures, including improvements in power supply and battery life optimization, such as power supply optimization by reducing power losses in computer architectures based on interface card power enable signaling.

BACKGROUND

Interface cards (or add-on cards) are widely used in computer architectures to connects devices, such as graphics cards, network cards, solid-state drives (SSD) cards (such as M.2-based cards), and the like, to a host central processing unit (CPU) of a computing device. Peripherals connected via an interface card communicate by sending packets across point-to-point communication channels called links. However, powering the interface cards in compliance with personal computer (PC) system standby requirements may be challenging.

BRIEF DESCRIPTION OF THE DRAWINGS

In the drawings, like numerals may describe the same or similar components or features in different views. Like numerals having different letter suffixes may represent different instances of similar components. Some embodiments are illustrated by way of example, and not limitation, in the figures of the accompanying drawings in which.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc., to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

The following description and the drawings sufficiently illustrate specific embodiments to enable those skilled in the art to practice them. Other embodiments may incorporate structural, logical, electrical, process, and other changes. Portions and features of some embodiments may be included in or substituted for, those of other embodiments. Embodiments outlined in the claims encompass all available equivalents of those claims.

To meet Modern Standby requirement of 1 mW of power consumption, interface cards in computer architectures (e.g., M.2 SSD, wireless local area network (WLAN), wireless wide area network (WWAN), Bluetooth, Card Electromechanical (CEM)-based interface cards, etc.) use power switch that is configured to cut off the power to the interface card during a power standby condition. A similar approach may be used to turn off the display panels to save power. The challenge with this approach is that usage of the power switch (which is connected in series between the power supply and the interface card) is associated with significant power dissipation in the system during an active state as well as overall system cost increase.

Figure 6:
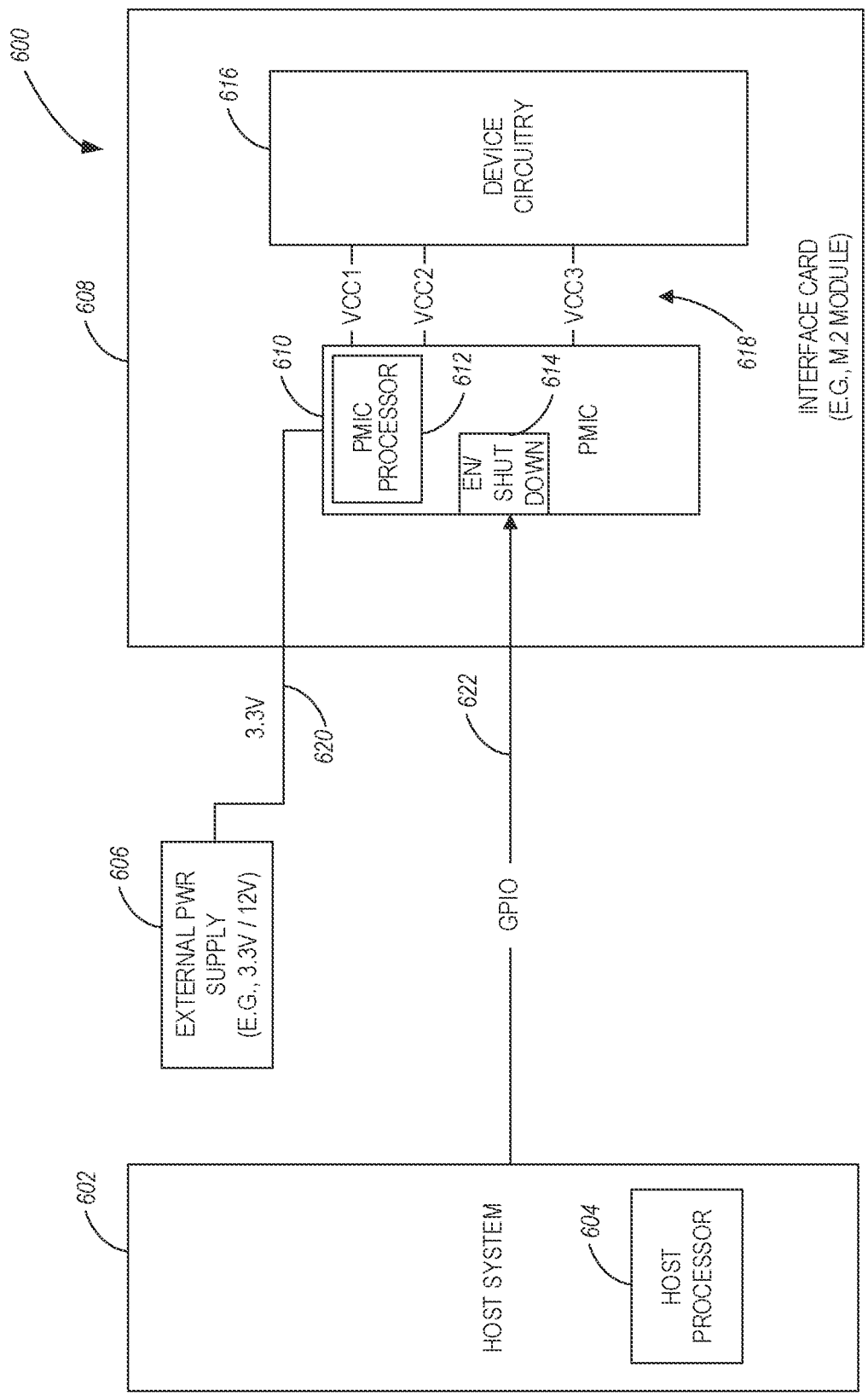
FIG. 6 illustrates a high-level diagram of an interface card with a PMIC using power enable signaling, in accordance with some embodiments.

Techniques disclosed herein can be used for configuring a power enable signal communicated from a host processor directly to a PMIC of an interface card (e.g., M.2-based card, CEM-based card, or other types of interface cards) control enabling or disabling of the power to the PMIC to meet the 1 mW Modern Standby requirement. An example interface card using such power enable signal communication is illustrated in FIG. 6.

Figure 1:
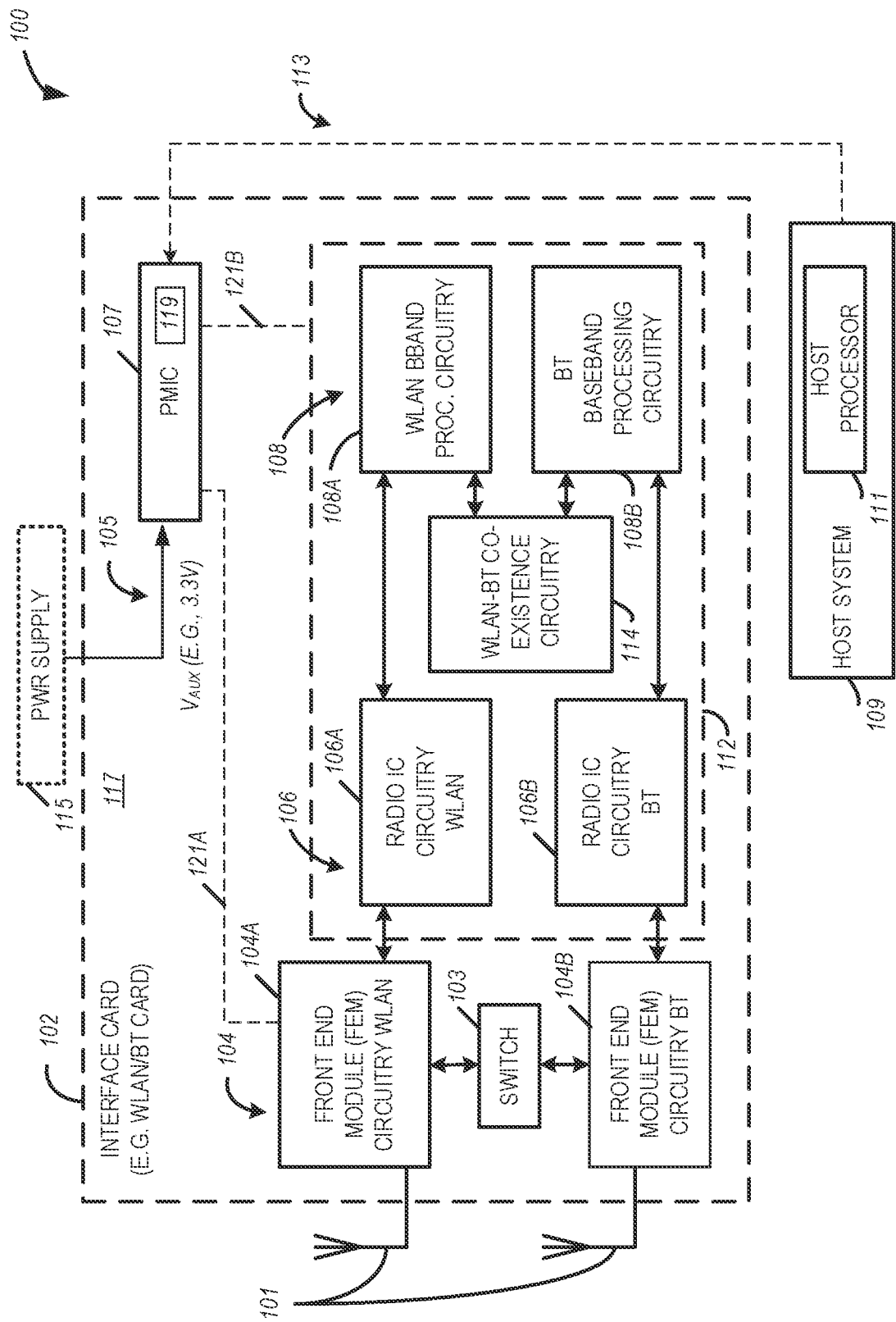
FIG. 1 is a block diagram of a radio architecture including an interface card with a power management integrated circuit (PMIC), in accordance with some embodiments.

FIG. 1 is a block diagram of a radio architecture 100 including an interface card 102 with a power management integrated circuit (PMIC) 107, in accordance with some embodiments. The radio architecture 100 may be implemented in a computing device (e.g., device 800 in FIG. 8) including user equipment (UE), a base station (e.g., a next generation Node-B (gNB), enhanced Node-B (eNB)), a smartphone, or another type of wired or wireless device. The radio architecture 100 may include radio front-end module (FEM) circuitry 104, radio integrated circuit (IC) circuitry 106, and baseband processing circuitry 108 configured as part of the interface card 102. In this regard, radio architecture 100 (as shown in FIG. 1) includes an interface card 102 configured to perform both Wireless Local Area Network (WLAN) functionalities and Bluetooth (BT) functionalities (e.g., as WLAN/BT interface or modem card), although embodiments are not so limited and the disclosed techniques apply to other types of radio architectures with different types of interface cards as well. In this disclosure, "WLAN" and "Wi-Fi" are used interchangeably. Other example types of interface cards which can be used in connection with the disclosed techniques include graphics cards, network cards, SSD cards (such as M.2-based cards), CEM-based cards, etc.

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101, to amplify the received signals, and to provide the amplified versions of the received signals to the WLAN radio IC circuitry 106A for further processing. The BT FEM circuitry 104B may include a receive signal path which may include circuitry configured to operate on BT RF signals received from the one or more antennas 101, to amplify the received signals and to provide the amplified versions of the received signals to the BT radio IC circuitry 106B for further processing. The FEM circuitry 104A may also include a transmit signal path which may include circuitry configured to amplify WLAN signals provided by the radio IC circuitry 106A for wireless transmission by the one or more antennas 101. Besides, the FEM circuitry 104B may also include a transmit signal path which may include circuitry configured to amplify BT signals provided by the radio IC circuitry 106B for wireless transmission by the one or more antennas. In the embodiment of FIG. 1, although FEM 104A and FEM 104B are shown as being distinct from one another, embodiments are not so limited and include within their scope the use of a FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the FEM circuitry 104A and provide baseband signals to WLAN baseband processing circuitry 108A. The BT radio IC circuitry 106B may, in turn, include a receive signal path which may include circuitry to down-convert BT RF signals received from the FEM circuitry 104B and provide baseband signals to BT baseband processing circuitry 108B. The WLAN radio IC circuitry 106A may also include a transmit signal path which may include circuitry to up-convert WLAN baseband signals provided by the WLAN baseband processing circuitry 108A and provide WLAN RF output signals to the FEM circuitry 104A for subsequent wireless transmission by the one or more antennas 101. The BT radio IC circuitry 106B may also include a transmit signal path which may include circuitry to up-convert BT baseband signals provided by the BT baseband processing circuitry 108B and provide BT RF output signals to the FEM circuitry 104B for subsequent wireless transmission by the one or more antennas 101. In the embodiment of FIG. 1, although radio IC circuitries 106A and 106B are shown as being distinct from one another, embodiments are not so limited and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 108 may include a WLAN baseband processing circuitry 108A and a BT baseband processing circuitry 108B. The WLAN baseband processing circuitry 108A may include a memory, such as, for example, a set of RAM arrays in a Fast Fourier Transform (FFT) or Inverse Fast Fourier Transform (IFFT) block (not shown) of the WLAN baseband processing circuitry 108A. Each of the WLAN baseband processing circuitry 108A and the BT baseband processing circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include physical layer (PHY) and medium access control layer (MAC) circuitry and may further interface with the host processor 111 for generation and processing of the baseband signals and for controlling operations of the radio IC circuitry 106.

Referring still to FIG. 1, according to the shown embodiment, WLAN-BT coexistence circuitry 114 may include logic providing an interface between the WLAN baseband processing circuitry 108A and the BT baseband processing circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the one or more antennas 101 are depicted as being respectively connected to the WLAN FEM circuitry 104A and the BT FEM circuitry 104B, embodiments include within their scope the sharing of the one or more antennas 101 as between the WLAN and BT FEMs, or the provision of more than one antenna connected to each of FEM 104A or 104B.

In some embodiments, the front-end module circuitry 104, the radio IC circuitry 106, and the baseband processing circuitry 108 may be provided on a single radio card, such as the interface card 102. In some other embodiments, the one or more antennas 101, the FEM circuitry 104, and the radio IC circuitry 106 may be provided on a single radio card. In some other embodiments, the radio IC circuitry 106 and the baseband processing circuitry 108 may be provided on a single chip or IC, such as IC 112.

In some embodiments, the interface card 102 may include a WLAN radio card and may be configured for Wi-Fi communications, although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers. In some embodiments, the interface card 102 may include a platform controller hub (PCH) system-on-a-chip (SOC) and a central processing unit (CPU)/host SOC.

In some of these multicarrier embodiments, radio architecture 100 may be part of a Wi-Fi communication station (STA) such as a wireless access point (AP), a base station, or a mobile device including a Wi-Fi enabled device. In some of these embodiments, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.1 lac, IEEE 802.11-2016, and/or 802.1 lax standards and/or proposed specifications for WLANs, although the scope of embodiments is not limited in this respect. Radio architecture 100 may also be suitable to transmit and/or receive communications in accordance with other techniques and standards, including a $3^{rd}$ Generation Partnership Project (3GPP) standard, including a communication standard used in connection with 5G or new radio (NR) communications.

In some embodiments, the radio architecture 100 may be configured for high-efficiency (HE) Wi-Fi communications in accordance with the IEEE 802.1 lax standard or another standard associated with wireless communications. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband processing circuitry 108B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection-oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as the interface card 102, although embodiments are not so limited, and include within their scope discrete WLAN and BT radio cards In some embodiments, the radio architecture 100 may include other radio cards, such as a cellular radio card configured for cellular (e.g., 3GPP such as LTE, LTE-Advanced, or 5G communications), which may be implemented together with (or as part of) the interface card 102.

In some IEEE 802.11 embodiments, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies, however.

In some embodiments, the interface card 102 includes a PMIC 107 configured to perform the disclosed functionalities. More specifically, the PMIC is mounted on circuit board 117 of the interface card 102 and it includes a PMIC processor 119 communicatively coupled to a host processor 111 of a host system (e.g., a host motherboard) 109. The PMIC processor 119 is configured to receive an input voltage signal 105 from a power supply 115 that is external to the interface card 102. The PMIC processor 119 is further configured to generate at least one output voltage signal (e.g., voltage signals 121A, 121B) based on the input voltage signal 105. The at least one output voltage signal (e.g., voltage signals 121A, 121B) is supplied to the circuitry of the interface card 102. The PMIC processor 119 is further configured to detect a power enable signal 113 originating from the host processor 111. The power enable signal 113 may be detected at a general-purpose input/output (GPIO) connector of the PMIC 107. The PMIC processor 119 is further configured to activate or deactivate the generation of the at least one output voltage signal based on the power enable signal 113.

In some embodiments, the PMIC processor 119 may detect the power enable signal 113 at a pin of the GPIO connector. The power enable signal 113 may be configured as a logical low or a logical high signal, and may be used by the PMIC processor 119 to power down the PMIC 107 or deactivate generation of the at least one output voltage signal when the power enable signal 113 is detected at the pin of the GPIO connector. In some embodiments, the PMIC can be placed in a low power state, such as a D3Cold low-power sub-state when the power enable signal 113 is de-asserted at the pin. Additional embodiments of the PMIC using the disclosed techniques are discussed in connection with FIG. 5-FIG. 7.

Figure 2:
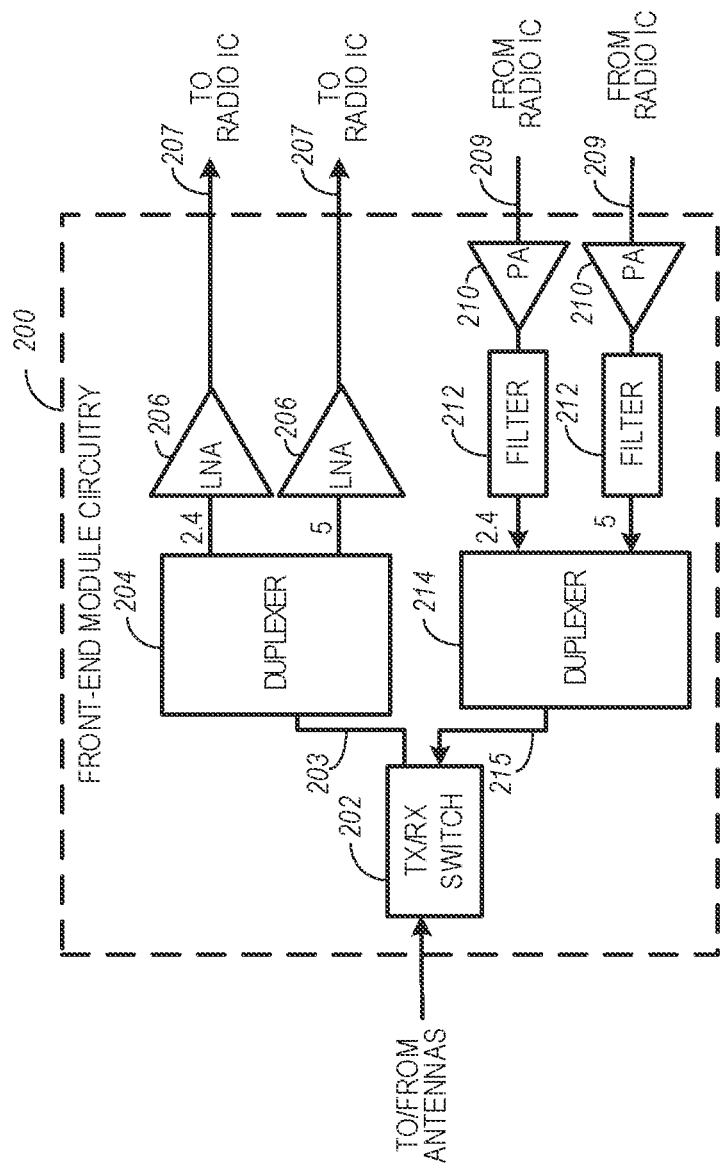
FIG. 2 illustrates a front-end module circuitry for use in the radio architecture of FIG. 1, in accordance with some embodiments.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit (TX) mode and receive (RX) mode operation. In some aspects, a diplexer may be used in place of a TX/RX switch. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the FEM circuitry 200 may include a power amplifier (PA) to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by the one or more antennas 101 (FIG. 1)).

In some dual-mode embodiments for Wi-Fi communication, the FEM circuitry 200 may be configured to operate in, e.g., either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a power amplifier (PA) 210 and one or more filters 212, such as a BPF, an LPF, or another type of filter for each frequency spectrum, and a transmit signal path duplexer 214 to provide the signals of one of the different spectrums onto a single transmit path for subsequent transmission by the one or more antennas 101 (FIG. 1). In some embodiments, BT communications may utilize the 2.4 GHz signal paths and may utilize the same FEM circuitry 200 as the one used for WLAN communications.

Figure 3:
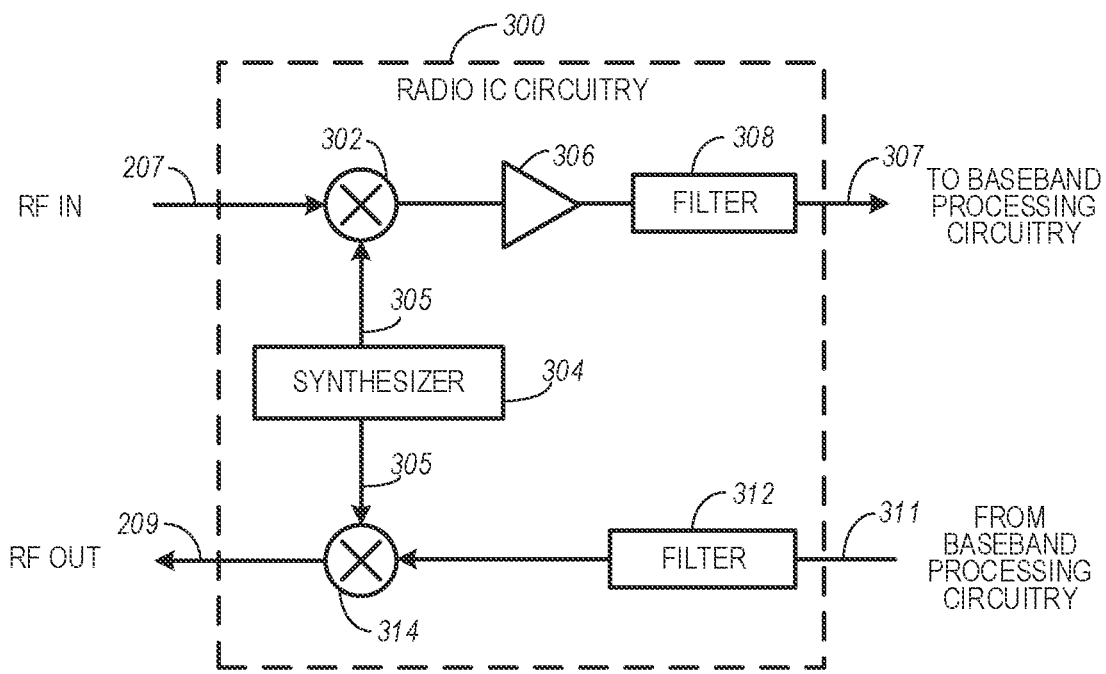
FIG. 3 illustrates a radio IC circuitry for use in the radio architecture of FIG. 1, in accordance with some embodiments.

FIG. 3 illustrates radio IC circuitry 300 in accordance with some embodiments. The radio IC circuitry 300 is one example of circuitry that may be suitable for use as the WLAN or BT radio IC circuitry 106A/106B (FIG. 1), although other circuitry configurations may also be suitable.

In some embodiments, the radio IC circuitry 300 may include a receive signal path and a transmit signal path. The receive signal path of the radio IC circuitry 300 may include mixer circuitry 302, such as, for example, down-conversion mixer circuitry, amplifier circuitry 306, and filter circuitry

308. The transmit signal path of the radio IC circuitry 300 may include at least filter circuitry 312 and mixer circuitry 314, such as up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry and may include, although not shown, embodiments where each of the depicted circuitries may include more than one component. For instance, mixer circuitry 302 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (FIG. 1) based on the synthesized frequency 305 provided by the synthesizer circuitry 304. The amplifier circuitry 306 may be configured to amplify the down-converted signals and the filter circuitry 308 may include an LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate RF output signals 209 for the FEM circuitry 104. The baseband signals 311 may be provided by the baseband processing circuitry 108 and may be filtered by filter circuitry 312. The filter circuitry 312 may include an LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of the synthesizer circuitry 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature-phase (Q) paths). In such an embodiment, RF input signal 207 from FIG. 2 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency (fLO) from a local oscillator or a synthesizer, such as LO frequency 305 of synthesizer circuitry 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in the duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature-phase (Q) path) may operate at a 25% duty cycle, which may result in a significant reduction in power consumption.

The RF input signal 207 (FIG. 2) may comprise a balanced signal, although the scope of the embodiments is not limited in this respect. The I and Q baseband output signals may be provided to the low-noise amplifier, such as amplifier circuitry 306 (FIG. 3) or to filter circuitry 308 (FIG. 3).

In some embodiments, the output baseband signals 307 and the input baseband signals 311 may be analog, although the scope of the embodiments is not limited in this respect. In some alternate embodiments, the output baseband signals 307 and the input baseband signals 311 may be digital. In these alternate embodiments, the radio IC circuitry may include an analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. In some embodiments, the synthesizer circuitry 304 may be a delta-sigma synthesizer, a frequency multiplier, or a synthesizer comprising a phase-locked loop with a frequency divider. According to some embodiments, the synthesizer circuitry 304 may include a digital frequency synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuitry 304 may be provided by a voltage-controlled oscillator (VCO), although that is not a requirement. A divider control input may further be provided by either the baseband processing circuitry 108 (FIG. 1) or the host processor 111 (FIG. 1) depending on the desired output frequency 305. In some embodiments, a divider control input (e.g., N) may be determined from a look-up table (e.g., within a Wi-Fi card) based on a channel number and a channel center frequency as determined or indicated by the host processor 111.

In some embodiments, synthesizer circuitry 304 may be configured to generate a carrier frequency as the output frequency 305, while in other embodiments, the output frequency 305 may be a fraction of the carrier frequency (e.g., one-half the carrier frequency, one-third the carrier frequency). In some embodiments, the output frequency 305 may be a LO frequency (fLO).

Figure 4:
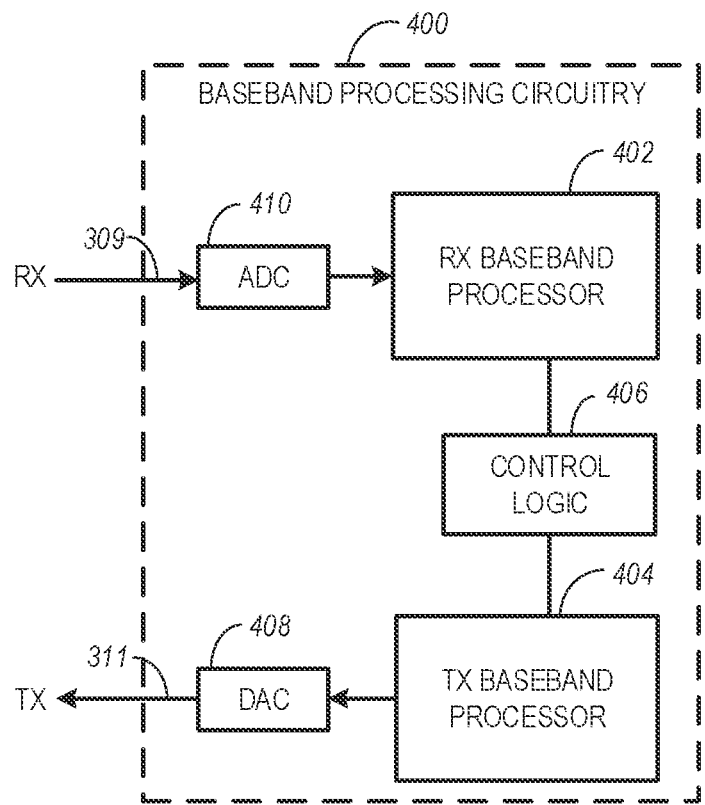
FIG. 4 illustrates a baseband processing circuitry for use in the radio architecture of FIG. 1, in accordance with some embodiments.

FIG. 4 illustrates a baseband processing circuitry 400 for use in the radio architecture of FIG. 1, in accordance with some embodiments. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing receive baseband signals 309 provided by the radio IC circuitry 106 (FIG. 1) and a transmit baseband processor (TX BBP) 404 for generating transmit baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include an analog-to-digital converter (ADC) 410 to convert analog baseband signals 309 received from the radio IC circuitry 106 to digital baseband signals for processing by the RX BBP 402. In these embodiments, the baseband processing circuitry 400 may also include a digital-to-analog converter (DAC) 408 to convert digital baseband signals from the TX BBP 404 to analog baseband signals 311.

In some embodiments that communicate OFDM signals or OFDMA signals, such as through the WBPC 108A, the TX BBP 404 may be configured to generate OFDM or OFDMA signals as appropriate for transmission by performing an inverse fast Fourier transform (IFFT). The RX BBP 402 may be configured to process received OFDM signals or OFDMA signals by performing an FFT. In some embodiments, the RX BBP 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some embodiments, the one or more antennas 101 (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. The one or more antennas 101 may each include a set of phased-array antennas, although embodiments are not so limited.

Although the radio architecture 100 is illustrated as having several separate functional elements, one or more of the functional elements may be combined and may be implemented by combinations of software configured elements, such as processing elements including digital signal processors (DSPs), and/or other hardware elements. For example, some elements may comprise one or more microprocessors, DSPs, field-programmable gate arrays (FPGAs), application-specific integrated circuits (ASICs), radio-frequency integrated circuits (RFICs), and combinations of various hardware and logic circuitry for performing at least the functions described herein. In some embodiments, the functional elements may refer to one or more processes operating on one or more processing elements.

Figure 5:
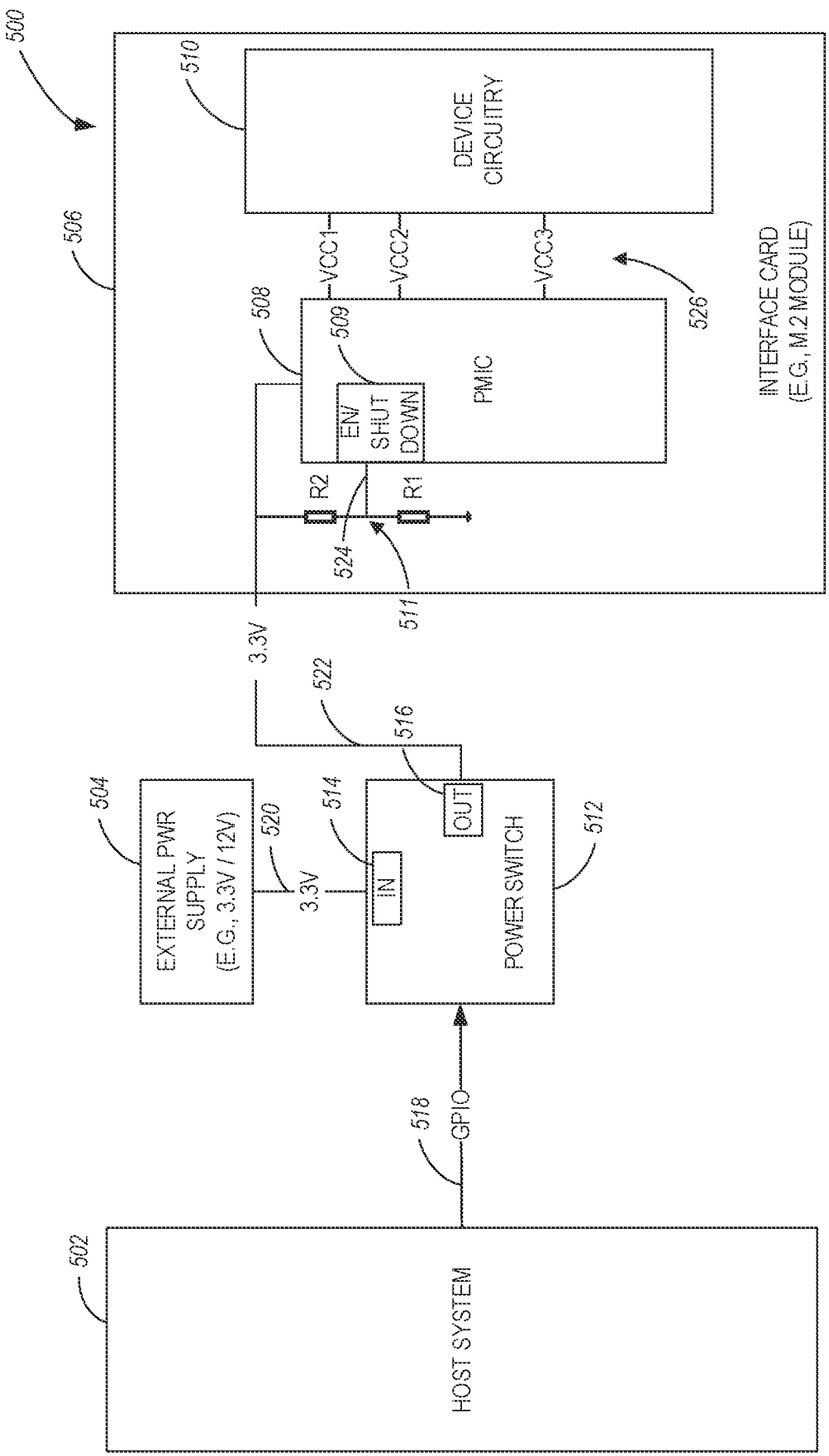
FIG. 5 illustrates a high-level diagram of an interface card, in accordance with some embodiments.

FIG. 5 illustrates a high-level diagram 500 of an interface card, in accordance with some embodiments. Referring to FIG. 5, interface card 506 is communicatively coupled to a host system (e.g., a host motherboard) via the power switch 512. The interface card 506 includes a PMIC 508 and device circuitry 510 (e.g., SOC devices and other circuitry associated with functionalities performed by the interface card).

An external power supply 504 is configured to provide an input voltage signal 522 on input port 514 of the power switch 512. The host system 502 may generate a power enable signal 518 which can be received at a GPIO connector of the power switch. The power switch 512 may enable or disable supply of the input voltage signal 520 as voltage signal 522 communicated from an output port 516 of the power switch to the interface card 506. The voltage signal 522 is used by the PMIC 508 to generate output voltage signals 526 for and the device circuitry 510. In some aspects, the voltage signal 522 may be scaled down by a voltage divider 511 to generate a second power enable signal 524 received at a GPIO connector 509 (e.g., an enable/disable pin of the GPIO connector). In this regard, the second power enable signal 524 is used for enabling or disabling the generation of the output voltage signals 526.

In some embodiments, using the power switch 512 in a serial communication path between the host system 502 and the interface card 506 may cause excessive power dissipation and system cost inefficiencies. FIG. 6 illustrates an alternative embodiment using the disclosed techniques and without the use of an external power switch, which reduces the active power loss and improves standby power and device battery life characteristics. Additional benefits of the embodiment in FIG. 6 include reduction in total system cost as well as reduced circuit board space.

FIG. 6 illustrates a high-level diagram 600 of an interface card 608 with a PMIC 610 using power enable signaling, in accordance with some embodiments. Referring to FIG. 6, interface card 608 is communicatively coupled to a host system 602 (e.g., a host motherboard) with a host processor 604 and an external power supply 606. The interface card 608 includes a PMIC 610 and device circuitry 616 (e.g., SOC devices and other circuitry associated with functionalities performed by the interface card 608). The PMIC 610 includes a PMIC processor 612 and a GPIO connector 614 configured to receive signals from the host processor 604. The interface card 608 may include a graphics card, a network card (e.g., a modem card), an SSD card (such as an M.2-based card including Key-E and Key-M based card), a display card, etc.

In some embodiments, the PMIC 610 is mounted on a circuit board of the interface card 608. The PMIC processor 612 is configured to receive an input voltage signal 620 from a power supply 606 that is external to the interface card. The PMIC processor 612 is further configured to generate at least one output voltage signal 618 based on the input voltage signal. The at least one output voltage signal 618 is supplied to the device circuitry 616. The PMIC processor 612 is further configured to detect a power enable signal 622 originating from the host processor 604. The power enable signal 622 is detected at the GPIO connector 614 of the PMIC 610. The PMIC processor 612 is further configured to deactivate the generation of the at least one output voltage signal 618 based on the power enable signal 622.

In some embodiments, the PMIC processor 612 is configured to place the PMIC 610 in a device low-power state based on the power enable signal 622. In some aspects, the device's low-power state is a D3Cold low-power sub-state.

In some embodiments, the power enable signal 622 is a logical high signal asserted at a GPIO pin of the GPIO connector 614. Additionally, the PMIC processor 612 is configured to perform the generation of the at least one output voltage signal 618 based on the logical high signal asserted at the GPIO pin.

In some embodiments, the PMIC processor 612 is configured to detect the logical high signal is de-asserted at the GPIO pin of the GPIO connector 614. The PMIC processor 612 is further configured to deactivate the generation of the at least one output voltage signal 618 based on the logical high signal being de-asserted at the GPIO pin.

In some embodiments, the PMIC processor 612 is configured to detect the power enable signal 622 as a logical low signal asserted at the GPIO pin of the GPIO connector 614. The PMIC processor 612 is further configured to deactivate the generation of the at least one output voltage signal 618 based on the logical low signal being asserted at the GPIO pin.

In some embodiments, the device circuitry 616 is a Card Electromechanical (CEM)-based device, and the power enable signal 622 is detected at a Joint Test Action Group (JTAG) connector pin of the PMIC 610.

In some embodiments, the power enable signal 622 is detected at an unused pin or a reserved pin of the PMIC 610.

Figure 7:
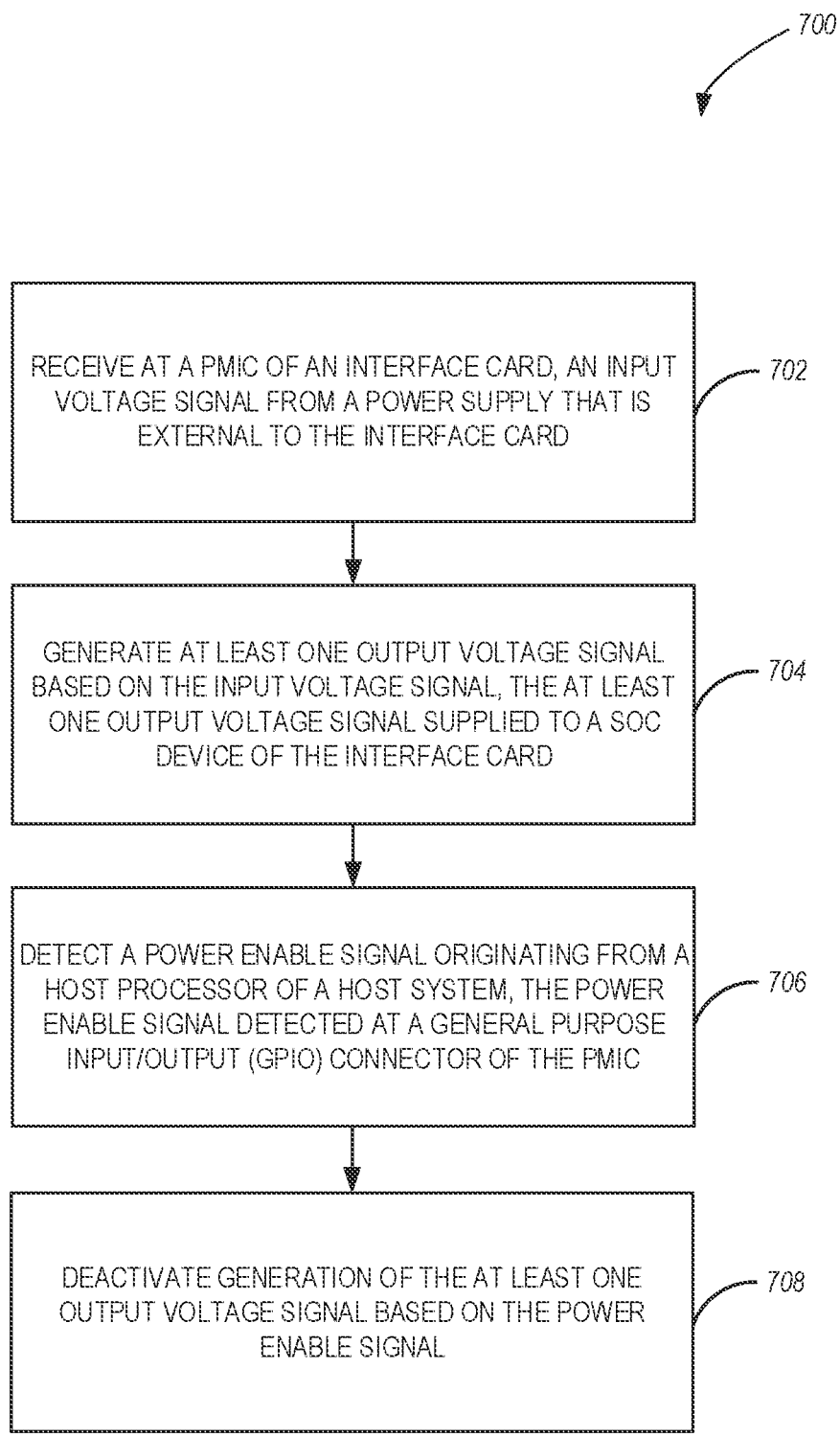
FIG. 7 illustrates a flow diagram of a method for controlling power supply to an interface card, in accordance with some embodiments.

FIG. 7 illustrates a flow diagram of a method 700 for controlling power supplied to an interface card, in accordance with some embodiments. Referring to FIG. 7, method 700 includes operations 702, 704, 706, and 708, which may be executed by PMIC circuitry such as a PMIC processor (e.g., PMIC processor 612 in FIG. 6) or another processor of a computing device (e.g., hardware processor 802 of device 800 illustrated in FIG. 8).

At operation 702, an input voltage signal (e.g., the voltage signal 620) is received at a PMIC of an interface card (e.g., PMIC 610 of interface card 608) from a power supply (e.g., power supply 606) that is external to the interface card.

At operation 704, at least one output voltage signal (e.g., at least one output voltage signal 618) is generated based on the input voltage signal. The at least one output voltage signal is supplied to a system-on-a-chip (SOC) device of the interface card (e.g., device circuitry 616).

At operation 706, a power enable signal originating from a host processor of a host system is detected. For example, the PMIC processor 612 detects power enable signal 622 from host processor 604. The power enable signal 622 is detected at a GPIO connector 614 of the PMIC 610.

At operation 708, generation of the at least one output voltage signal is deactivated based on the power enable signal 622.

In some embodiments, the PMIC 610 is placed in a device low-power state based on the power enable signal 622. The device low-power state may include a D3Cold low-power sub-state.

In some embodiments, the power enable signal 622 is a logical high signal asserted at a GPIO pin of the GPIO connector 614. The PMIC processor 612 may perform the generation of the at least one output voltage signal 618 based on the logical high signal asserted at the GPIO pin.

In some embodiments, the PMIC processor 612 may detect the logical high signal is de-asserted at the GPIO pin of the GPIO connector, and may deactivate the generation of the at least one output voltage signal 618 based on the logical high signal being de-asserted at the GPIO pin.

In some embodiments, the PMIC processor 612 may detect a logical low signal is asserted at the GPIO pin of the GPIO connector, and may deactivate the generation of the at least one output voltage signal based on the logical low signal being asserted at the GPIO pin.

Figure 8:
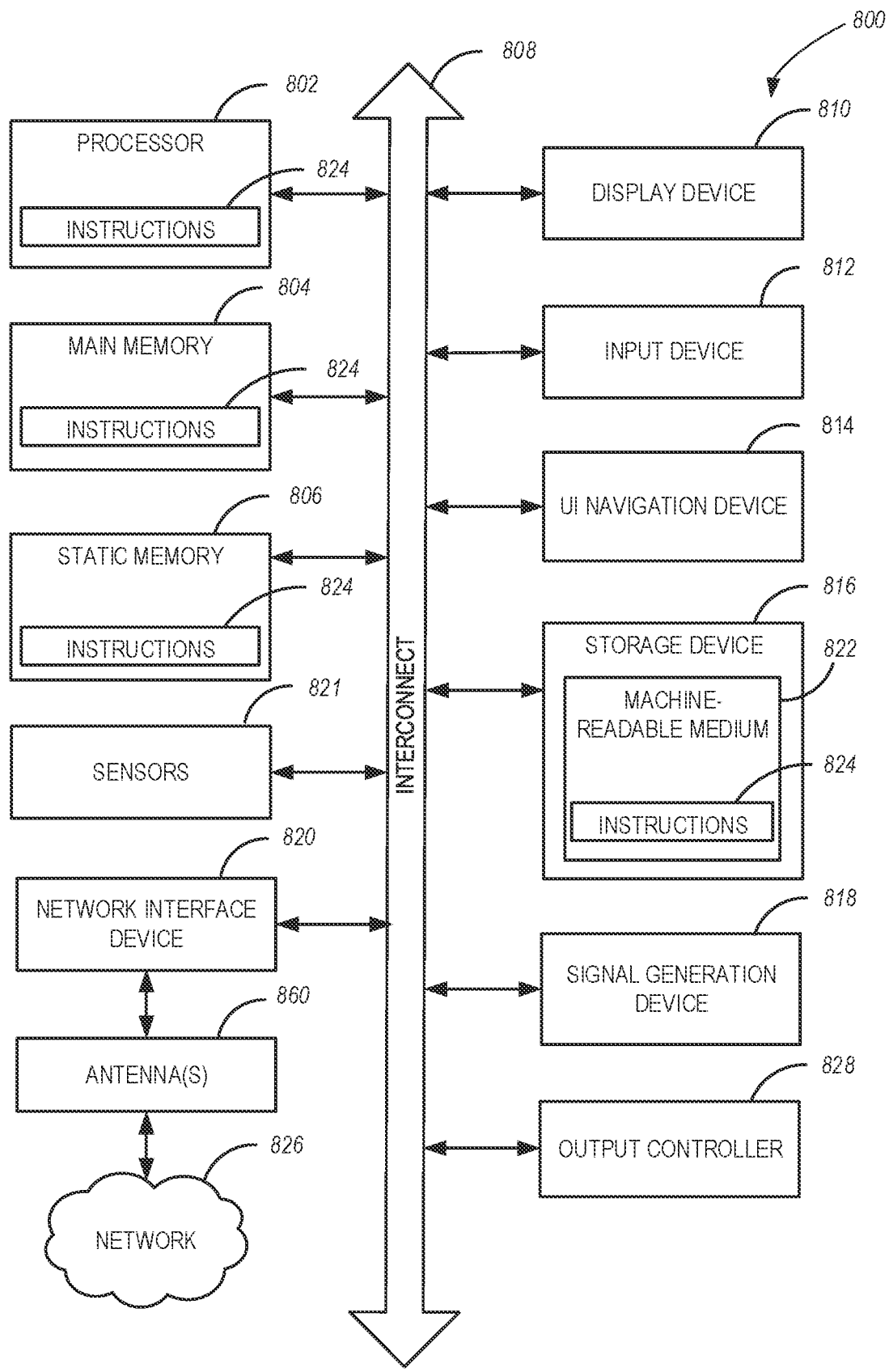
FIG. 8 illustrates a block diagram of an example machine upon which any one or more of the operations/techniques (e.g., methodologies) discussed herein may perform.

FIG. 8 illustrates a block diagram of an example machine 800 upon which any one or more of the techniques (e.g., methodologies) discussed herein may perform. In alternative embodiments, the machine 800 may operate as a standalone device or may be connected (e.g., networked) to other machines. In a networked deployment, machine 800 may operate in the capacity of a server machine, a client machine, or both in server-client network environments. In an example, the machine 800 may act as a peer machine in a peer-to-peer (P2P) (or other distributed) network environment. The machine 800 may be a personal computer (PC), a tablet PC, a set-top box (STB), a personal digital assistant (PDA), a portable communications device, a mobile telephone, a smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine (e.g., computer system) 800 may include a hardware processor 802 (e.g., a central processing unit (CPU), a graphics processing unit (GPU), a hardware processor core, or any combination thereof), a main memory 804, and a static memory 806, some or all of which may communicate with each other via an interlink (e.g., bus) 808.

Specific examples of main memory 804 include Random Access Memory (RAM), and semiconductor memory devices, which may include, in some embodiments, storage locations in semiconductors such as registers. Specific examples of static memory 806 include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; RAM; and CD-ROM and DVD-ROM disks.

Machine 800 may further include a display device 810, an input device 812 (e.g., a keyboard), and a user interface (UI) navigation device 814 (e.g., a mouse). In an example, the display device 810, input device 812, and UI navigation device 814 may be a touch screen display. The machine 800 may additionally include a storage device (e.g., drive unit or another mass storage device) 816, a signal generation device 818 (e.g., a speaker), a network interface device 820, and one or more sensors 821, such as a global positioning system (GPS) sensor, compass, accelerometer, or other sensors. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In some embodiments, the processor 802 and/or instructions 824 may comprise processing circuitry and/or transceiver circuitry.

The storage device 816 may include a machine-readable medium 822 on which is stored one or more sets of data structures or instructions 824 (e.g., software) embodying or utilized by any one or more of the techniques or functions described herein. The instructions 824 may also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 may constitute machine-readable media.

Specific examples of machine-readable media may include non-volatile memory, such as semiconductor memory devices (e.g., EPROM or EEPROM) and flash memory devices; magnetic disks, such as internal hard disks and removable disks; magneto-optical disks; RAM; and CD-ROM and DVD-ROM disks.

While the machine-readable medium 822 is illustrated as a single medium, the term "machine-readable medium" may include a single medium or multiple media (e.g., a centralized or distributed database, and/or associated caches and servers) configured to store one or more instructions 824.

An apparatus of the machine 800 may be one or more of a hardware processor 802 (e.g., a central processing unit (CPU), a graphics processing unit (GPU), a hardware processor core, or any combination thereof), a main memory 804 and a static memory 806, one or more sensors 821, a network interface device 820, antennas 860, a display device 810, an input device 812, a UI navigation device 814, a storage device 816, instructions 824, a signal generation device 818, and an output controller 828. The apparatus may be configured to perform one or more of the methods and/or operations disclosed herein. The apparatus may be intended as a component of the machine 800 to perform one or more of the methods and/or operations disclosed herein, and/or to perform a portion of one or more of the methods and/or operations disclosed herein. In some embodiments, the apparatus may include a pin or other means to receive power. In some embodiments, the apparatus may include power conditioning hardware.

The term "machine-readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine-readable medium examples may include solid-state memories and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine-readable media may include non-transitory machine-readable media. In some examples, machine-readable media may include machine-readable media that is not a transitory propagating signal.

The instructions 824 may further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others.

In an example, the network interface device 820 may include one or more physical jacks (e.g., Ethernet, coaxial, or phone jacks) or one or more antennas to connect to the communications network 826. In an example, the network interface device 820 may include one or more antennas 860 to wirelessly communicate using at least one single-input multiple-output (SIMO), multiple-input multiple-output (MIMO), or multiple-input single-output (MISO) techniques. In some examples, the network interface device 820 may wirelessly communicate using Multiple User MIMO techniques. The term "transmission medium" shall be taken to include any intangible medium that is capable of storing, encoding, or carrying instructions for execution by the machine 800, and includes digital or analog communications signals or other intangible media to facilitate communication of such software.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or concerning external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using the software, the general-purpose hardware processor may be configured as respective different modules at different times. The software may accordingly configure a hardware processor, for example, to constitute a particular module at one instance of time and to constitute a different module at a different instance of time.

Some embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM);

random access memory (RAM); magnetic disk storage media; optical storage media; flash memory, etc.

The above-detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof) or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect.

Antennas referred to herein may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to $\frac{1}{10}$ of a wavelength or more.

Described implementations of the subject matter can include one or more features, alone or in combination as illustrated below by way of examples.

Example 1 is an interface card comprising: a circuit board; a device mounted on the circuit board; and a power management integrated circuit (PMIC) mounted on the circuit board, the PMIC comprising a PMIC processor communicatively coupled to a host processor of a host system, the PMIC processor configured to receive an input voltage signal from a power supply that is external to the interface card; generate at least one output voltage signal based on the input voltage signal, the at least one output voltage signal supplied to the device; detect a power enable signal originating from the host processor, the power enable signal detected at a general-purpose input/output (GPIO) connector of the PMIC; and deactivate the generation of the at least one output voltage signal based on the power enable signal.

In Example 2, the subject matter of Example 1 includes subject matter where the PMIC processor is configured to place the PMIC in a device low-power state based on the power enable signal.

In Example 3, the subject matter of Example 2 includes D3Cold low-power sub-state.

In Example 4, the subject matter of Examples 1-3 includes subject matter where the power enable signal is a logical high signal asserted at a GPIO pin of the GPIO connector, and wherein the PMIC processor is configured to perform the generation of the at least one output voltage signal based on the logical high signal asserted at the GPIO pin.

In Example 5, the subject matter of Example 4 includes subject matter where the PMIC processor is configured to detect the logical high signal is de-asserted at the GPIO pin of the GPIO connector; and deactivate the generation of the at least one output voltage signal based on the logical high signal being de-asserted at the GPIO pin.

In Example 6, the subject matter of Examples 4-5 includes subject matter where the PMIC processor is configured to detect a logical low signal is asserted at the GPIO pin of the GPIO connector; and deactivate the generation of the at least one output voltage signal based on the logical low signal being asserted at the GPIO pin.

In Example 7, the subject matter of Examples 1-6 includes subject matter where the device is a Card Electromechanical (CEM)-based device, and wherein the power enable signal is detected at a Joint Test Action Group (JTAG) connector pin of the connector.

In Example 8, the subject matter of Examples 1-7 includes subject matter where the power enable signal is detected at an unused pin of the connector.

In Example 9, the subject matter of Examples 1-8 includes subject matter where the power enable signal is detected at a reserved pin of the connector.

Example 10 is a method comprising: receiving at a power management integrated circuit (PMIC) of an interface card, an input voltage signal from a power supply that is external to the interface card; generating at least one output voltage signal based on the input voltage signal, the at least one output voltage signal supplied to a system-on-a-chip (SOC) device of the interface card; detecting a power enable signal originating from a host processor of a host system, the power enable signal detected at a general-purpose input/output (GPIO) connector of the PMIC; and deactivating the generation of the at least one output voltage signal based on the power enable signal.

In Example 11, the subject matter of Example 10 includes, placing the PMIC in a device low-power state based on the power enable signal.

In Example 12, the subject matter of Example 11 includes D3Cold low-power sub-state.

In Example 13, the subject matter of Examples 10-12 includes subject matter where the power enable signal is a logical high signal asserted at a GPIO pin of the GPIO connector, and the method further comprising: performing the generation of the at least one output voltage signal based on the logical high signal asserted at the GPIO pin.

In Example 14, the subject matter of Example 13 includes, detecting the logical high signal is de-asserted at the GPIO pin of the GPIO connector; and deactivating the generation of the at least one output voltage signal based on the logical high signal being de-asserted at the GPIO pin.

In Example 15, the subject matter of Examples 13-14 includes, detecting a logical low signal is asserted at the GPIO pin of the GPIO connector; and deactivating the generation of the at least one output voltage signal based on the logical low signal being asserted at the GPIO pin.

Example 16 is at least one non-transitory machine-readable storage medium comprising instructions stored thereupon, which when executed by processing circuitry of an interface card, cause the processing circuitry to perform operations comprising: receiving at a power management integrated circuit (PMIC) of the interface card, an input voltage signal from a power supply that is external to the interface card; generating at least one output voltage signal based on the input voltage signal, the at least one output voltage signal supplied to a system-on-a-chip (SOC) device; detecting a power enable signal originating from a host processor of a host system, the power enable signal detected at a general-purpose input/output (GPIO) connector of the PMIC; and deactivating the generation of the at least one output voltage signal based on the power enable signal.

In Example 17, the subject matter of Example 16 includes subject matter where the processing circuitry is further configured to perform operations comprising: placing the PMIC in a device low-power state based on the power enable signal.

In Example 18, the subject matter of Examples 16-17 includes subject matter where the power enable signal is a logical high signal asserted at a GPIO pin of the GPIO connector, and wherein the processing circuitry is further configured to perform operations comprising: performing the generation of the at least one output voltage signal based on the logical high signal asserted at the GPIO pin.

In Example 19, the subject matter of Example 18 includes subject matter where the processing circuitry is further configured to perform operations comprising: detecting the logical high signal is de-asserted at the GPIO pin of the GPIO connector; and deactivating the generation of the at least one output voltage signal based on the logical high signal being de-asserted at the GPIO pin.

In Example 20, the subject matter of Examples 18-19 includes subject matter where the processing circuitry is further configured to perform operations comprising: detecting a logical low signal is asserted at the GPIO pin of the GPIO connector, and deactivating the generation of the at least one output voltage signal based on the logical low signal being asserted at the GPIO pin.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined regarding the appended claims, along with the full scope of equivalents to which such claims are entitled.

What is claimed is:

1. An interface card comprising:
   a circuit board;
   a device mounted on the circuit board; and
   a power management integrated circuit (PMIC) mounted on the circuit board, the PMIC comprising a PMIC processor communicatively coupled to a host processor of a host system, the PMIC processor configured to:
   receive an input voltage signal from a power supply that is external to the interface card;
   generate at least one output voltage signal based on the input voltage signal, the at least one output voltage signal supplied to the device;
   detect a power enable signal originating from the host processor, the power enable signal detected at a general-purpose input/output (GPIO) connector of the PMIC; and
   deactivate generation of the at least one output voltage signal based on the power enable signal.

2. The interface card of claim 1, wherein the PMIC processor is configured to:
   place the PMIC in a device low-power state based on the power enable signal.

3. The interface card of claim 2, wherein the device low-power state is a D3Cold low-power sub-state.

4. The interface card of claim 1, wherein the power enable signal is a logical high signal asserted at a GPIO pin of the GPIO connector, and wherein the PMIC processor is configured to:
   perform the generation of the at least one output voltage signal based on the logical high signal asserted at the GPIO pin.

5. The interface card of claim 4, wherein the PMIC processor is configured to:
   detect the logical high signal is de-asserted at the GPIO pin of the GPIO connector; and
   deactivate the generation of the at least one output voltage signal based on the logical high signal being de-asserted at the GPIO pin.

6. The interface card of claim 4, wherein the PMIC processor is configured to:
  detect a logical low signal is asserted at the GPIO pin of the GPIO connector; and
  deactivate the generation of the at least one output voltage signal based on the logical low signal being asserted at the GPIO pin.

7. The interface card of claim 1, wherein the device is a Card Electromechanical (CEM)-based device, and wherein the power enable signal is detected at a Joint Test Action Group (JTAG) connector pin of the connector.

8. The interface card of claim 1, wherein the power enable signal is detected at an unused pin of the connector.

9. The interface card of claim 1, wherein the power enable signal is detected at a reserved pin of the connector.

10. A method comprising:
  receiving at a power management integrated circuit (PMIC) of an interface card, an input voltage signal from a power supply that is external to the interface card;
  generating at least one output voltage signal based on the input voltage signal, the at least one output voltage signal supplied to a system-on-a-chip (SOC) device of the interface card;
  detecting a power enable signal originating from a host processor of a host system, the power enable signal detected at a general-purpose input/output (GPIO) connector of the PMIC; and
  deactivating generation of the at least one output voltage signal based on the power enable signal.

11. The method of claim 10, further comprising:
  placing the PMIC in a device low-power state based on the power enable signal.

12. The method of claim 11, wherein the device low-power state is a D3Cold low-power sub-state.

13. The method of claim 10, wherein the power enable signal is a logical high signal asserted at a GPIO pin of the GPIO connector, and the method further comprising:
  performing the generation of the at least one output voltage signal based on the logical high signal asserted at the GPIO pin.

14. The method of claim 13, further comprising:
  detecting the logical high signal is de-asserted at the GPIO pin of the GPIO connector; and
  deactivating the generation of the at least one output voltage signal based on the logical high signal being de-asserted at the GPIO pin.

15. The method of claim 13, further comprising:
  detecting a logical low signal is asserted at the GPIO pin of the GPIO connector; and
  deactivating the generation of the at least one output voltage signal based on the logical low signal being asserted at the GPIO pin.

16. At least one non-transitory machine-readable storage medium comprising instructions stored thereupon, which when executed by processing circuitry of an interface card, cause the processing circuitry to perform operations comprising:
  receiving at a power management integrated circuit (PMIC) of the interface card, an input voltage signal from a power supply that is external to the interface card;
  generating at least one output voltage signal based on the input voltage signal, the at least one output voltage signal supplied to a system-on-a-chip (SOC) device;
  detecting a power enable signal originating from a host processor of a host system, the power enable signal detected at a general-purpose input/output (GPIO) connector of the PMIC; and
  deactivating generation of the at least one output voltage signal based on the power enable signal.

17. The at least one non-transitory machine-readable storage medium of claim 16, wherein the processing circuitry is further configured to perform operations comprising:
  placing the PMIC in a device low-power state based on the power enable signal.

18. The at least one non-transitory machine-readable storage medium of claim 16, wherein the power enable signal is a logical high signal asserted at a GPIO pin of the GPIO connector, and wherein the processing circuitry is further configured to perform operations comprising:
  performing the generation of the at least one output voltage signal based on the logical high signal asserted at the GPIO pin.

19. The at least one non-transitory machine-readable storage medium of claim 18, wherein the processing circuitry is further configured to perform operations comprising:
  detecting the logical high signal is de-asserted at the GPIO pin of the GPIO connector; and
  deactivating the generation of the at least one output voltage signal based on the logical high signal being de-asserted at the GPIO pin.

20. The at least one non-transitory machine-readable storage medium of claim 18, wherein the processing circuitry is further configured to perform operations comprising:
  detecting a logical low signal is asserted at the GPIO pin of the GPIO connector; and
  deactivating the generation of the at least one output voltage signal based on the logical low signal being asserted at the GPIO pin.

* * * * *